US009261869B2

(12) United States Patent
Cheng et al.

(10) Patent No.: US 9,261,869 B2
(45) Date of Patent: Feb. 16, 2016

(54) HYBRID SEQUENTIAL AND SIMULTANEOUS PROCESS SIMULATION SYSTEM

(75) Inventors: Xu Cheng, Pittsburgh, PA (US); Kirt T. Bush, Pittsburgh, PA (US)

(73) Assignee: EMERSON PROCESS MANAGEMENT POWER & WATER SOLUTIONS, INC., Pittsburgh, PA (US)

( * ) Notice: Subject to any disclaimer, the term of this patent is extended or adjusted under 35 U.S.C. 154(b) by 814 days.

(21) Appl. No.: 13/372,252

(22) Filed: Feb. 13, 2012

(65) Prior Publication Data

US 2013/0211601 A1    Aug. 15, 2013

(51) Int. Cl.
G05D 7/00 (2006.01)
G05B 17/02 (2006.01)
G06F 17/50 (2006.01)

(52) U.S. Cl.
CPC ............ *G05B 17/02* (2013.01); *G06F 17/5018* (2013.01)

(58) Field of Classification Search
CPC .............................. G05B 17/02; G06F 17/5018
See application file for complete search history.

(56) References Cited

U.S. PATENT DOCUMENTS

| | | | | |
|---|---|---|---|---|
| 3,379,864 | A * | 4/1968 | Petersen | 434/126 |
| 5,241,296 | A * | 8/1993 | Naka et al. | 340/525 |
| 5,315,530 | A | 5/1994 | Gerhardt et al. | |
| 5,551,770 | A * | 9/1996 | Hrovat et al. | 303/167 |
| 5,619,433 | A * | 4/1997 | Wang et al. | 703/18 |
| 6,611,736 | B1 * | 8/2003 | Waite | G06F 17/5018 700/281 |
| 6,637,463 | B1 * | 10/2003 | Lei et al. | 137/803 |
| 6,748,349 | B1 * | 6/2004 | Majumdar | G05B 17/02 703/2 |
| 6,810,370 | B1 * | 10/2004 | Watts, III | 703/10 |
| 6,816,820 | B1 * | 11/2004 | Friedl et al. | 703/2 |
| 6,993,963 | B1 * | 2/2006 | Gudmundsson | 73/152.52 |
| 7,024,342 | B1 * | 4/2006 | Waite | B22D 17/32 700/118 |
| 7,039,565 | B1 * | 5/2006 | Jin | G06F 17/5004 703/2 |
| 7,103,483 | B2 * | 9/2006 | Yamaguchi et al. | 702/50 |
| 7,241,423 | B2 * | 7/2007 | Golbig et al. | 422/130 |
| 7,431,407 | B2 * | 10/2008 | Kamiya et al. | 303/114.3 |
| 7,542,885 | B1 | 6/2009 | Majumdar | |

(Continued)

OTHER PUBLICATIONS

Bandyopadhyay, A; Hamill, B; Ramachandran, N.; and Majumdar, A.., "Network Flow Simulation of Fluid Transients in Rocket Propulsion Systems", Dec. 2011, JANNAF 8th MSS, 6th LPS, 5th SPS Joint Meeting.*

(Continued)

*Primary Examiner* — Mohammad Ali
*Assistant Examiner* — Kelvin Booker
(74) *Attorney, Agent, or Firm* — Marshall, Gerstein & Borun LLP

(57) ABSTRACT

A pressure and flow calculation technique that efficiently solves for pressures and flows within a process network uses both a simultaneous and a sequential solving method. The calculation technique first determines a flow conductance for each of the process network elements, linearizes pressure and flow relationships in each flow path by determining a linearized flow conductance for each process element and then determines a composite process network having a linearized, composite process component in each flow path to produce a simplified process network. A simultaneous solving method is then used to simultaneously solve for the pressures and flows at each of a set of junction nodes of the simplified process network and thereafter a sequential solving method is applied to determine the pressures and flows at the other nodes of the process network.

46 Claims, 6 Drawing Sheets

(56) References Cited

U.S. PATENT DOCUMENTS

| | | | |
|---|---|---|---|
| 7,617,082 B2* | 11/2009 | Childs | G06F 17/5009 703/10 |
| 7,663,754 B2* | 2/2010 | Okcay et al. | 356/432 |
| 7,725,301 B2* | 5/2010 | Shah et al. | 703/10 |
| 7,880,883 B2* | 2/2011 | Okcay et al. | 356/432 |
| 8,038,230 B2* | 10/2011 | Nakamura | 303/116.4 |
| 8,175,859 B1* | 5/2012 | Wu | G06Q 10/04 703/9 |
| 8,260,594 B2* | 9/2012 | Tardy et al. | 703/9 |
| 8,403,061 B2* | 3/2013 | Russell et al. | 166/369 |
| 8,612,189 B2* | 12/2013 | Golinveaux et al. | 703/6 |
| 8,635,051 B1* | 1/2014 | Wu | G06N 3/126 703/9 |
| 8,727,783 B2* | 5/2014 | Chen | 434/219 |
| 8,776,895 B2* | 7/2014 | Li et al. | 166/369 |
| 2002/0106311 A1* | 8/2002 | Golbig et al. | 422/130 |
| 2002/0169589 A1* | 11/2002 | Banki | G01V 11/00 703/15 |
| 2002/0169785 A1* | 11/2002 | Netemeyer | G01V 11/00 |
| 2003/0128251 A1* | 7/2003 | Ujita | 347/29 |
| 2004/0153804 A1* | 8/2004 | Blevins et al. | 714/33 |
| 2004/0230411 A1* | 11/2004 | Zheng et al. | 703/6 |
| 2005/0162010 A1* | 7/2005 | Kamiya et al. | 303/113.4 |
| 2006/0277011 A1* | 12/2006 | Tardy et al. | 703/10 |
| 2007/0126282 A1* | 6/2007 | Hwang | 303/10 |
| 2008/0177518 A1* | 7/2008 | Krishnamoorthy et al. | 703/9 |
| 2008/0221845 A1* | 9/2008 | Yu et al. | 703/2 |
| 2009/0107230 A1* | 4/2009 | Okcay et al. | 73/148 |
| 2009/0234595 A1* | 9/2009 | Okcay et al. | 702/49 |
| 2010/0057418 A1* | 3/2010 | Li | E21B 47/00 703/10 |
| 2010/0204963 A1* | 8/2010 | Shapiro | G06F 17/5018 703/1 |
| 2010/0299122 A1* | 11/2010 | Golinveaux | G05B 17/02 703/9 |
| 2010/0299124 A1* | 11/2010 | Sun | E21B 43/00 703/10 |
| 2010/0318337 A1* | 12/2010 | Bailey et al. | 703/10 |
| 2011/0040536 A1* | 2/2011 | Levitan | 703/2 |
| 2011/0045451 A1* | 2/2011 | Ragauskas et al. | 434/268 |
| 2011/0131017 A1* | 6/2011 | Cheng et al. | 703/2 |
| 2011/0191080 A1* | 8/2011 | Klie | 703/10 |
| 2012/0303345 A1* | 11/2012 | Kumar | G06F 17/5018 703/9 |
| 2013/0086898 A1* | 4/2013 | Yang et al. | 60/413 |
| 2013/0096889 A1* | 4/2013 | Khvoenkova et al. | 703/2 |
| 2013/0116993 A1* | 5/2013 | Maliassov | G01V 9/00 703/2 |
| 2013/0138406 A1* | 5/2013 | Khvoenkova et al. | 703/2 |
| 2013/0204587 A1* | 8/2013 | Cheng et al. | 703/2 |
| 2013/0239566 A1* | 9/2013 | Kim et al. | 60/534 |
| 2014/0088934 A1* | 3/2014 | Liang et al. | 703/2 |

OTHER PUBLICATIONS

Batalov, A., "Pressure-Flow Network Modeling, TTK 4550 Project Report", Dec. 2011, Department of Engineering and Cybernetics, Norwegian University of Science and Technology (NTNU).*

Majumdar, A. and Ravindran, S.S., "Numerical Prediction of Conjugate Heat Transfer in Fluid Network", Jun. 2011, Journal of Propulsion and Power, vol. 27, No. 3.*

Great Britain Search Report for Application No. GB1302541.6, dated Jul. 31, 2013.

* cited by examiner

HYBRID SEQUENTIAL AND SIMULTANEOUS PROCESS SIMULATION SYSTEM

TECHNICAL FIELD

The present invention relates generally to simulating the operation of flow networks such as those used in power generation plants, industrial manufacturing plants, processing plants and other types of process plants and, more particularly, to a system and method for efficiently solving pressure/flow parameters in real-time in a process network simulation system.

DESCRIPTION OF THE RELATED ART

Distributed process control systems, like those typically used in power generation, chemical manufacturing, petroleum processing, industrial manufacturing or other types of plants, typically include one or more controllers communicatively coupled to a plurality of field devices via analog, digital, combined analog/digital, or wireless buses. The field devices, which may be, for example, valves, valve positioners, switches, transmitters (e.g., temperature, pressure, level and flow rate sensors), burners, heat exchangers, furnaces, etc. are located within the plant environment and perform process functions such as opening or closing valves, measuring process parameters, etc., in response to control signals developed and sent by the controllers. Smart field devices, such as the field devices conforming to any of the well-known Fieldbus protocols, may also perform control calculations, alarming functions, and other functions commonly implemented within or by a plant controller. The plant controllers, which are also typically located within the plant environment, receive signals indicative of process measurements made by the field devices and/or other information pertaining to the field devices and implement a control application that executes, for example, different control modules which make process control decisions, generate process control signals based on the received information and coordinate with the control modules or blocks being executed in the field devices, such as HART® and FOUNDATION® Fieldbus field devices. The control modules within the controller send the process control signals over the communication lines or networks to the field devices to thereby control the operation of the process.

Information from the field devices and the controller is usually made available over a data highway to one or more other computer devices, such as operator workstations, personal computers, data historians, report generators, centralized databases, etc., typically placed in control rooms or other locations away from the harsher plant environment. These computer devices may also run applications that may, for example, enable an operator to perform functions with respect to the process, such as changing settings of the process control routine, modifying the operation of the control modules within the controller or the field devices, viewing the current state of the process, viewing alarms generated by field devices and controllers, keeping and updating a configuration database, etc.

As an example, the Ovation® control system, sold by Emerson Process Management, includes multiple applications that are typically stored within and executed by different devices located at diverse places within a process plant. A configuration application, which resides in one or more operator workstations, enables users to create or change process control modules and to download these process control modules via a data highway to dedicated distributed controllers. Typically, these control modules are made up of communicatively interconnected function blocks, which are objects in an object oriented programming protocol and which perform functions within the control scheme based on inputs thereto and provide outputs to other function blocks within the control scheme. The configuration application may also allow a designer to create or change operator interfaces, which are used by a viewing application to display data to an operator and to enable the operator to change settings, such as set-points, within the process control routine. Each of the dedicated controllers and, in some cases, field devices, stores and executes a controller application that runs the control modules assigned and downloaded thereto to implement actual process control functionality. The viewing applications, which may be run on one or more operator workstations, receive data from the controller application via the data highway and display this data to process control system designers, operators, or users using the user interfaces. A data historian application is typically stored in and executed by a data historian device that collects and stores some or all of the data provided across the data highway while a configuration database application may be executed in a still further computer attached to the data highway to store the current process control routine configuration and data associated therewith. Alternatively, the configuration database may be located in the same workstation as the configuration application.

In many industries it is desirable to implement a simulation system for simulating the operation of a plant or a process network (including the various plant devices and the control network as connected within the plant). Such a simulation system may be used to test the operation of the plant in response to new or different control variables, such as set-points, to test new control routines, to perform optimization, to perform training activities, etc. As a result, many different types of plant simulation systems have been proposed and used in process plants. None-the-less, only the most complex simulation systems are typically able to perform high fidelity simulation of a process plant because of the complex processes being implemented, the ever changing conditions within the plant including the degradation of devices over time and the presence of unaccounted for disturbance variables within the plant.

When simulating commercial industrial process equipment, it is common and well known to use first principle physical laws or equations to implement one or more simulation models used in a simulation system. In this case, a complex set of first principle equations is developed to model the various plant equipment, and a simulator solves all or most of the model equations. There are two common solving methods used to solve these equations. The first such method can be loosely termed as a sequential solving method because, in this case, the pressure and flow variables at each of the different process components are solved individually in sequence, typically starting at the upstream process components and moving to the downstream process components. However, in this approach, a simulator has to include a mechanism to reconcile flow differences between various ones of the process components if the various different sequential calculations do not converge to produce the same flow values at each of the different process nodes. This sequential solving approach has the advantage of fast execution because total flow convergence is not required at each time step, i.e., at each simulation cycle time because small flow differences can be dealt with in the pressure/flow calculations performed in the next simulation cycle. However, the pressure and flow propagation speed through the network is slow, and if not handled appropriately, the flow imbalances can result in a poor degree of simulation fidelity.

The other, more popular approach to solving first principle equations in a simulation system can be loosely termed as the simultaneous solving method. In this type of simulation, a centralized or common nonlinear equation solver is utilized to solve all of the pressure and flow equations for the entire process network together or simultaneously during each discrete sampling time interval. A Newton-type of equation solver is typically employed, but other types of solvers can be used as well. By solving for all of the pressure and flow relationships at all of the process nodes at the same time in a single location, flow mismatches between different process components is avoided, as the equations are solved simultaneously to assure flow balance at every node of the simulated process network. However, this technique has the disadvantage that it can take a long time and/or a great deal of processing power to find a solution during each time interval or simulation cycle. This fact makes this technique sometimes impractical for real-time simulation applications, especially in large process networks having a lot of process nodes. Another shortcoming of this approach is that the entire equation structure is prebuilt or pre-established, and the centralized solver may therefore experience difficulty in handling matrix singularities that can arise in certain situations. For example, when two valves in the same straight flow path are both closed, the solver may not be able to determine the pressures in between these valves, if the equations are not processed properly.

In addition, there are two basic types of simulation systems that are used to simulate process networks, including centralized simulation systems and distributed simulation systems. Centralized simulation systems typically include or use the simultaneous solving method at a centralized location to solve for the pressures and flows at each of the nodes of the entire process network. The Newton-Raphson method is a well-known example of a calculation technique typically used in centralized simulation systems to perform simultaneous solving of numerous first principle equations when performing process network simulation. In fact, this type of equation solving mechanism is, in many cases, perceived as a requirement for high-fidelity simulation. However, a major drawback associated with this type of simulation system is that the physical models are complex and computationally expensive, especially when the system to be modeled is highly nonlinear and interactive. As a result, these types of simulation systems are usually slow, computationally inefficient, and may be numerically unreliable in certain process situations.

Distributed simulation systems, on the other hand, attempt to overcome some of the problems associated with centralized simulation techniques by performing the various simulation tasks throughout a number of different devices (e.g., processors), and these simulation tasks are implemented (executed) separately or independently of one another. Distributed simulation systems, which typically implement a sequential solving methodology, provide a number of advantages over centralized simulation systems, including space decoupling, time decoupling, integrator decoupling and the ability to use parallel processing. In particular, distributed simulation systems provide space decoupling by breaking down a large simulation problem into a set of smaller sub-problems, thereby allowing one simulation module to be changed, updated or added without affecting the other simulation modules. Distributed simulation systems also provide time decoupling by allowing the use of different integration step sizes for different dynamic modules, which means that these systems can provide better numerical robustness and higher computational efficiency for hard to solve simulation problems without needing to implement an overly aggressive integration step size in each of the simulation modules. Distributed simulation systems provide integrator decoupling as the separate simulation modules can use specific and tailor made integration methods that are different from one another in different modules, thereby enabling different mathematical techniques to be used to solve the different process models. Distributed simulation systems also enable the use of parallel processing, as the different simulation modules can be implemented at the same time on a distributed network of computers. This feature also allows for easy trouble shooting, as problems can usually be identified locally with respect to a particular simulation module.

However, efficient solving of the pressure-flow variables at each of the process nodes by the distributed simulated network is an important part of real-time process simulation, as without it, the simulation will not be very accurate or useful. In particular, in process flow network simulations, fluid pressure and fluid flow at or through each of the simulated process components need to be calculated during each discrete sampling time interval while observing the mass conservation law at any given moment. Because all of the process components being simulated are connected together in a network, the time required to complete the entire set of calculations can be challenging, especially when the network size is large, due at least in part to the slow propagation of pressure and flow calculations between the various different simulation modules within the distributed simulation system.

SUMMARY

A pressure and flow calculation technique that can be used in a centralized or a distributed process network simulation system to efficiently solve for pressures and flows at various nodes of a process network uses aspects of both a simultaneous solving method and a sequential solving method. In particular, the pressure and flow calculation method uses a simultaneous solving method to determine the pressures and the flows at each of a set of junction nodes within the process network, at which flows either converge or diverge. The calculation method then uses the pressure and flow values determined for the junction nodes of the process network to sequentially solve for the pressures and flows at the other non-junction nodes of the process network.

More particularly, the pressure and flow calculation technique may first determine a flow conductance value for each of the process network components or elements of the process network based on the make-up of that component and the current state of that component, such as the location or position of a valve closure member within a valve, etc. The technique may then linearize pressure and flow relationships in each flow path of a process network by determining a linearized flow conductance for each process component within the network using the determined flow conductance and the well known quadratic pressure/flow relationship. The technique may then form a single composite linearized process component (having a composite linearized flow conductance) in each flow path of the process network to produce a simplified process network having input and output boundary nodes (also referred to herein as starting and stopping nodes) and junction nodes (nodes at which flows converge or diverge) separated by composite linearized process components along each of a set of flow paths. Thereafter, a simultaneous solving method may be used to develop a set of pressure and flow equations for the junction nodes of the composite or simplified process network and to simultaneously solve these equations to produce a set of pressure values for the junction nodes that results in balanced flow at each of the junction nodes of the process network. Next, a sequential solving method is applied to determine the pressures and flows at each of the other nodes of the process network based on the pressures and flows at each of the junction nodes.

In a general case, the flow conductances for each process element in the process network may be determined during each simulation cycle based on the current conditions within the process component using, for example, first principle equations or models. In this manner, valve settings, etc., may be used to determine the flow conductance or the linearized flow conductance at any particular process element being modeled in the process network at any particular time. Furthermore, the structure and parameters of equations or matrices used in the sequential solving step may be generated anew during each sampling time or simulation cycle of the simulation system to take into account the newly determined composite linearized flow conductances in each flow path, thereby taking into account the actual states of the process elements within the process network at any particular time.

Importantly, this hybrid pressure/flow calculation technique provides for fast execution speeds during each simulation cycle because the set of simultaneous equations being solved is greatly reduced in size and complexity as compared to typical simulation systems that simultaneously solve all of the process nodes together, making this technique suitable for real-time simulation applications. Moreover, because the process element flow conductances are determined anew in any particular simulation cycle based on the actual state of the process elements (and thus are dynamically determined in real-time), and because all upstream and downstream simulation modules are known to each other via a chained system ID, this technique is able to re-construct systems of equations during run-time more effectively, and thus avoids the occurrence of matrix singularities within the set of simultaneously solved pressure and flow equations, leading to stable numerical results in the process network simulation system even when various nodes of the process network are isolated from the rest of the network due to current process network settings or conditions.

DETAILED DESCRIPTION

Figure 1:
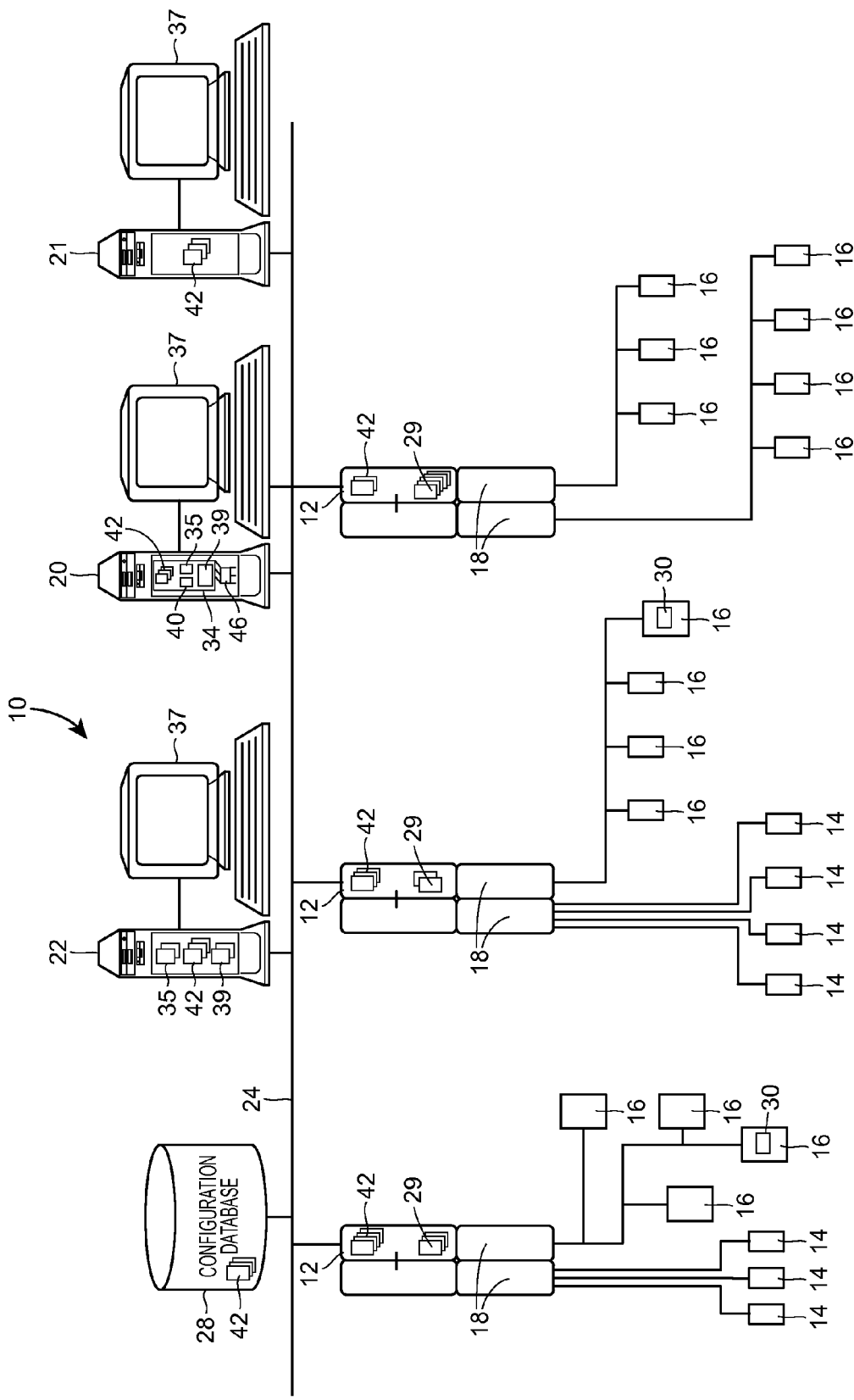
FIG. 1 is a block diagram of a distributed process control network located within a process plant such as a power plant, including one or more operator workstations, controllers, or virtual controllers and a simulation system having one or more simulation modules configured to accurately simulate the operation of the process plant or process network.

Referring now to FIG. 1, an example distributed control network for a plant 10, such as that associated with a power generation plant, an industrial manufacturing plant, a processing plant, etc., is illustrated at an abstract level of detail. The plant 10 includes a distributed control system having one or more controllers 12, each of which is connected to one or more field devices 14 and 16 via input/output (I/O) devices or cards 18 which may be, for example, Fieldbus interfaces, Profibus® interfaces, HART® interfaces, standard 4-20 ma interfaces, etc. The controllers 12 are also coupled to one or more host or operator workstations 20, 21 and 22 via a data highway 24 which may be, for example, an Ethernet link. A database 28 may be connected to the data highway 24 and operates as a data historian to collect and store parameter, status and other data associated with the controllers 12 and field devices 14, 16 within the plant 10. Additionally or alternatively, the database 28 may operate as a configuration database that stores the current configuration of the process control system within the plant 10 as downloaded to and stored within the controllers 12 and field devices 14 and 16. While the controllers 12, the I/O cards 18 and the field devices 14 and 16 are typically located within and are distributed throughout the sometimes harsh plant environment, the operator workstations 20, 21 and 22 and the database 28 are usually located in control rooms or other less harsh environments easily assessable by controller or maintenance personnel.

As is known, each of the controllers 12, which may be by way of example, the Ovation® controller sold by Emerson Process Management Power and Water Solutions, Inc., stores and executes a controller application that implements a control strategy using any number of different, independently executed, control modules or blocks 29. Each of the control modules 29 can be made up of what are commonly referred to as function blocks wherein each function block is a part or a subroutine of an overall control routine and operates in conjunction with other function blocks (via communications called links) to implement process control loops within the process plant 10. As is well known, function blocks, which may be but need not be objects in an object oriented programming protocol, typically perform one of an input function, such as that associated with a transmitter, a sensor or other process parameter measurement device, a control function, such as that associated with a control routine that performs proportional-integral-derivative (PID), fuzzy logic, etc. control, or an output function that controls the operation of some device, such as a valve, to perform some physical function within the process plant 10. Of course hybrid and other types of complex function blocks exist such as model predictive controllers (MPCs), optimizers, etc.

In the plant 10 illustrated in FIG. 1, the field devices 14 and 16 connected to the controllers 12 may be standard 4-20 ma devices, may be smart field devices, such as HART®, Profibus®, or FOUNDATION® Fieldbus field devices, which include a processor and a memory, or may be any other desired types of field devices. Some of these devices, such as Fieldbus field devices (labeled with reference number 16 in FIG. 1), may store and execute modules, or sub-modules, such as function blocks, associated with the control strategy implemented in the controllers 12. Function blocks 30, which are illustrated in FIG. 1 as being disposed in two different ones of the Fieldbus field devices 16, may be executed in conjunction with the execution of the control modules 29 within the controllers 12 to implement one or more process control loops, as is well known. Of course, the field devices 14 and 16 may be any types of devices, such as sensors, valves, transmitters, positioners, etc., and the I/O devices 18 may be any types of I/O devices conforming to any desired communication or controller protocol such as HART®, Fieldbus, Profibus®, etc.

Still further, in a known manner, one or more of the workstations 20-22 may include user interface applications to enable a user, such as an operator, a configuration engineer, a maintenance person, etc., to interface with the process control network within the plant 10. In particular, the workstation 22 is illustrated as including a memory 34 which stores one or more user interface applications 35 which may be executed on a processor 46 within the workstation 22 to communicate with the database 28, the control modules 29 or other routines within the controllers 12 or I/O devices 18, with the field devices 14 and 16 and the modules 30 within these field devices, etc., to obtain information from the plant, such as information related to the ongoing state of the plant equipment or the control system. The user interface applications 35 may process and/or display this collected information on a display device 37 associated with one or more of the workstations 20-22. The collected, processed and/or displayed information may be, for example, process state information, alarms and alerts generated within plant, maintenance data, etc. Likewise, one or more applications 39 may be stored in and executed in the workstations 20-22 to perform configuration activities such as creating or configuring the modules 29 and 30 to be executed within the plant, to perform operator activities, such as changing set-points or other control variables, within the plant, etc. Of course the number and type of routines 35 and 39 are not limited by the description provided herein and other numbers and types of process control related routines may be stored in and implemented within the workstations 20-22 if desired.

The workstations 20-21, the database 28 and some of the controllers 12 of FIG. 1 are also illustrated as including components of a simulation system that may be implemented in either a single location or in a distributed computer network, such as that of FIG. 1. In particular, the workstation 20 is illustrated as including a set of simulation support applications 40, which may include a simulation configuration application, a user interface application and data structures for performing simulation of the process plant 10 in a manner described herein. Generally speaking, the simulation support applications 40 enable a user to create, implement and view the results of a distributed simulation system within one or more of the computers of the system of FIG. 1. More particularly, the simulation system may be configured and executed on a single computer device or processor, such as on the workstation 20, or may include various simulation modules stored and executed in different computer or processor devices to form a distributed simulation system that includes various distributed simulation modules 42 located in various different computing devices (also referred to as drops) on the computer network of FIG. 1. In particular, a "drop" is a computing device or a virtual computing device that calculates or executes one or more of the simulation or control algorithm/modules. Each of the simulation modules 42 may store a model that is implemented to simulate the operation of an individual plant component or a group of components, and the simulation modules 42 may communicate directly with one another to implement a simulation of a larger portion of the plant 10. Any particular simulation module 42 may be used to simulate any portion or part of the plant 10, including a particular piece of plant equipment involved in processing or material flow, such as a tank, a heat exchanger, a controller, etc., or a group of equipment, such as a unit. Still further, the simulation modules 42 may be located in and executed in the same computing device as a centralized simulator or may be executed in various different devices as part of a distributed simulation system. In a distributed simulation system, the various computer or processors used to execute different simulation modules are referred to as simulation drops. However, in a distributed simulation system, the simulation modules 42 located in different simulation drops are communicatively coupled to one another via a computer network, for example, the communication bus 24 of FIG. 1, to send data between the simulation modules 42 so as to perform simulation of a larger group or set of plant equipment. In this case, to implement the simulation techniques described herein, the distributed simulation system may include a set of distributed simulation modules 42 each responsible for simulating one or more physical devices of the process network and a centralized or coordinating simulation module that will be responsible for determining pressures and flows at all of a set of junction nodes within the process network. Of course, any desired number of simulation modules 42 may be located in any particular simulation drop and each simulation drop may execute the simulation modules 42 therein in coordination with the other simulation drops as described herein so as to implement a distributed simulation. However, if desired, all of the simulation modules 42 associated with any particular simulation may be stored in and executed by the same computer device (i.e., at a single simulation drop) and be implemented in the manner described herein.

The simulation support applications 40 may be accessed by any authorized user (such as a configuration engineer, an operator or some other type of user) and may be used to create and configure a particular instance of a distributed simulation system, by creating a set of simulation modules 42 and downloading these modules 42 to a single simulation computer or to different simulation drops within the plant or computer network. As illustrated in FIG. 1, various ones of the simulation modules 42 may be downloaded to and implemented in the workstations 20-22, the controllers 12, the database 28 and/or any other computer device or processing device connected to the communication network 24. If desired, simulation modules 42 may be located and implemented in a single or in multiple other processing devices that are indirectly connected to the network 24, such as in the field devices 16, in a business local area network (LAN) or even a wide area network (WAN) connected to one of the devices on the network 24. Still further, while the bus 24 is illustrated in FIG. 1 as the main communication network used to connect various drops that implement simulation modules, other types of communication networks could be used to connect simulation drops, including any desired LANs, WANs, the internet, wireless networks, etc.

Once created and downloaded, the simulation modules 42 may execute individually but operate in conjunction with one another to perform simulation of the plant or components and equipment within the plant, as being controlled by the control blocks 29 and 30 as well as other controller routines executed within the controllers 12 and possibly the field devices 14, 16. The simulation system may enable a user to perform different simulation and prediction activities with respect to the plant 10, via a user interface application in the suite of simulation support applications 40. If desired, a simulation system may simulate an operating plant or any portion thereof, such as that illustrated in FIG. 1, or may simulate a plant that is not operating on-line or even a plant that has not actually been constructed.

Generally speaking, and as noted above, some prior art simulation systems were developed as a centralized simulation system in which all of the equipment models and pressure/flow equations within the process network were solved simultaneously at a common location (e.g., in the same processor) using a simultaneous solving technique. However, these types of simulation systems were very computationally expensive, especially when the process network being simulated included a larger number of nodes at which the pressures and flows needed to be determined during each simulation cycle, making these types of simulation systems typically unsuitable for real-time simulation applications (i.e., in applications in which the simulation system is able to simulate the operation of the process in real-time because the calculations in each simulation cycle take less time to perform than the time period associated with each simulation cycle). Moreover, these simulation systems were susceptible to numerical inaccuracies in certain situations in which, for example, mathematical singularities arose in the simultaneously solved equations due to settings within the process network components.

Moreover, as also noted above, other known simulation systems have performed sequential solving in which the pressures and flows at each node were solved sequentially for the various different process nodes. For example, some distributed simulation systems included simulation components executed in separate computing devices with the simulation components using first principle algorithms and in which the simulation components operated in sequence using the outputs of the adjacent simulation components. However, these types of simulation systems had difficulty in providing coordination between the separate simulation components because of the need to balance mass flows and to equalize or match pressures, etc. between the separate process nodes. This was especially problematic in simulation systems in which downstream components affected the mass flow rates and pressures of upstream components. For example, the shutting or closing of a valve downstream of a set of plant components affects the upstream mass flows and pressures, and a simulation system must account for these changes.

The simulation system described herein implements a hybrid simulation technique that first solves for the pressures and flows at some or all of the junction nodes of the process network simultaneously to assure mass balances within the simulated process network, and that then solves the process models at the others of the nodes individually or in some situations in groups, based on the determined junction node pressures and flows. In this manner, all of the major equipment/component models can be based on first-principle equations, if desired. Moreover, this technique regenerates the set of simultaneous equations used to solve for pressures and flows at the junction nodes during each simulation cycle to assure that no mathematical singularities occur within the simultaneously solved equations.

While the hybrid simulation system described herein can be used in any desired type of plant to simulate material flow through the plant (liquids, gases or even solids), one example centralized simulation system and one example distributed simulation system are described herein as being used to simulate a process plant. However, the hybrid simulation technique described herein can be used in other types of plants and control systems, including any industrial manufacturing and processing plants, water and waste water treatment plants, etc., and can be used with control systems implemented centrally or as distributed control systems.

Figure 2:
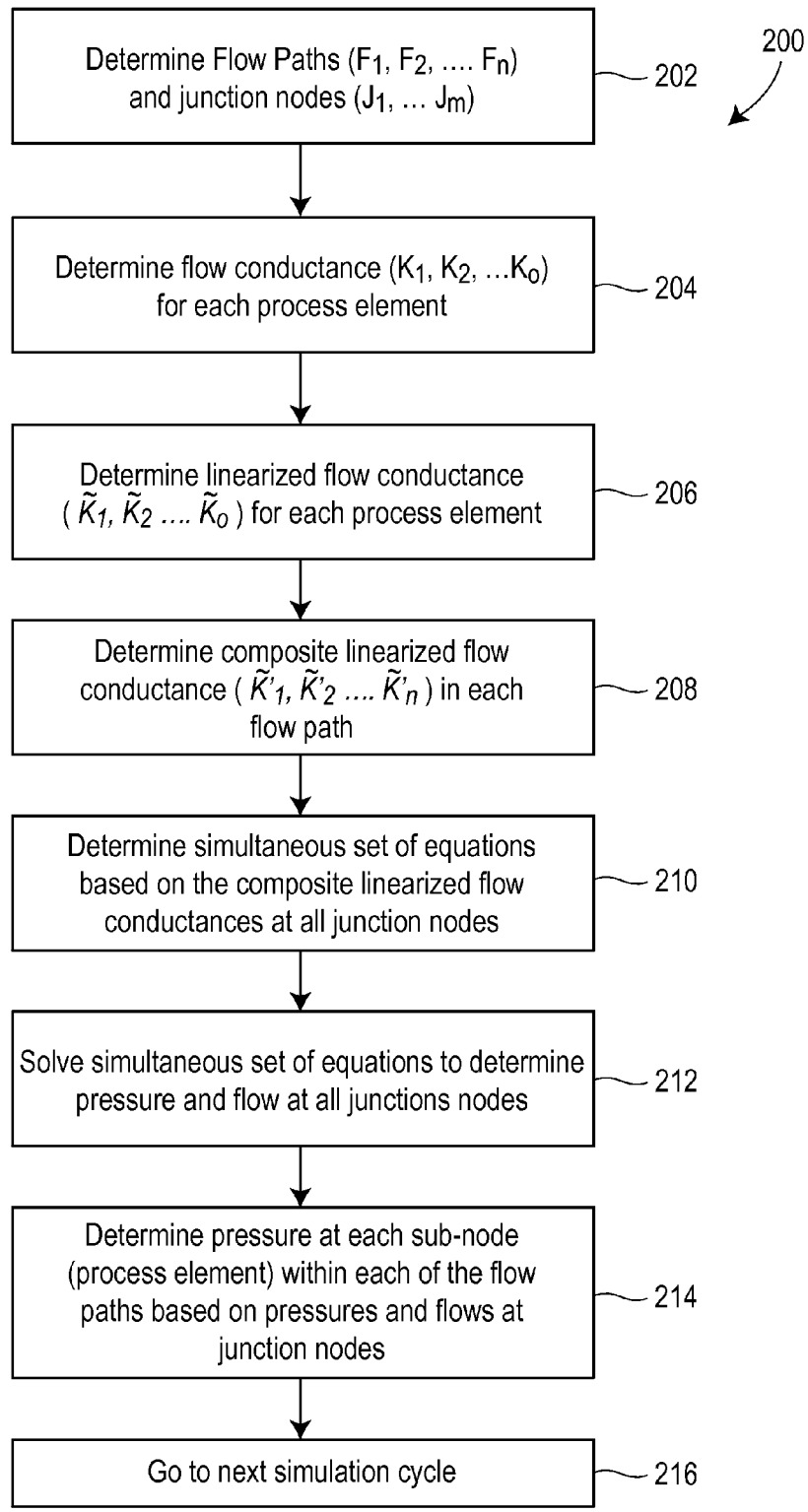
FIG. 2 illustrates a flow chart associated with a simulation technique used to perform pressure and flow calculations in a process network having one or more junction nodes at which flows converge or diverge.
Figure 3A:
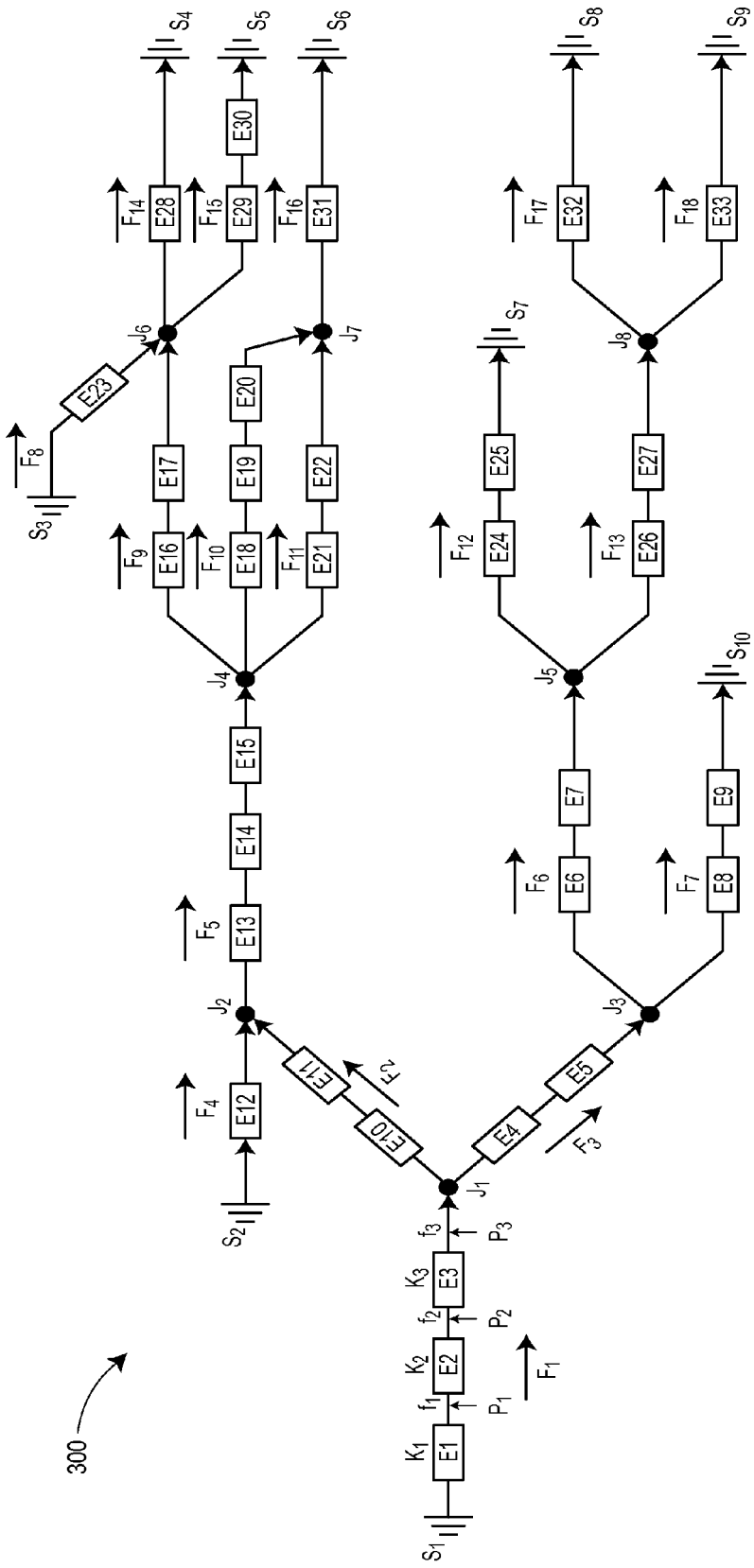
FIG. 3A illustrates an example process network having a set of interconnected process nodes and flow paths to be simulated by a simulation system.
Figure 3B:
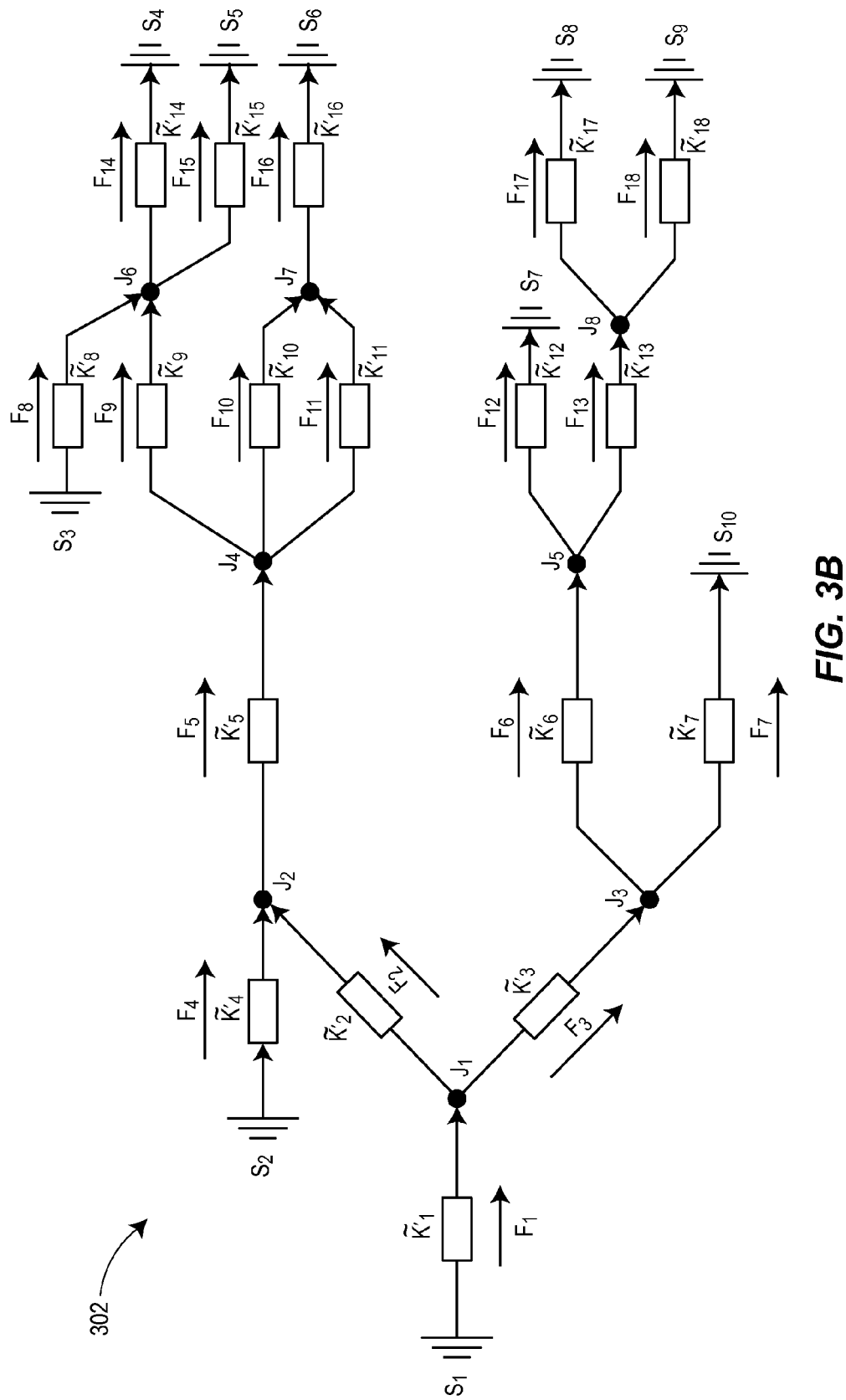
FIG. 3B illustrates a composite linearized network diagram created for the process network of FIG. 3A, having various starting, stopping and junction nodes separated by composite linearized process elements.

Referring now to FIGS. 2 and 3A-3B, a hybrid methodology for determining or calculating pressures and flows at the various different nodes of a process network will be described. In particular, FIG. 2 illustrates a flow chart of a method or a simulation routine 200 having steps to be performed by a simulation system to simulate a process network having a series of junction nodes (i.e., nodes at which fluid flow converges or diverges) and non-junction nodes, such as that illustrated in FIG. 3A, to determine pressures and flows at each point or node of the process network. Generally, the pressure and flow calculation technique of FIG. 2 can be performed during each simulation cycle or sampling time by a centralized simulation system executed on a single computer device, such as one of the workstations 20-22 of FIG. 1, or may be implemented during each simulation cycle or time sample in a distributed simulation system in which various different simulation routines are stored and executed at different, but communicatively connected, simulation drops. In any event, the simulation system that implements the technique of FIG. 2 may use one or more simulations modules, each of which may implement first principle equations or other equations to model or simulate various different process elements within a process network. These simulation modules may, in some cases, model or simulate a group or a number of process elements within the process network and, in some cases, may model or simulate a single process element within the process network.

Generally speaking, the method 200 of FIG. 2 determines the pressures and flows at each of the nodes of a process network by determining the flow conductances of each of the process elements within the process network, based at least in part on the current process conditions, linearizing those pressure-flow relationships and producing a set of composite linearized flow conductances in each flow path of the process network. Next, the method of FIG. 2 develops a set of equations to solve for the pressure and flows at each of the junction nodes of the composite process network and solves those equations in a simultaneous manner to produce values of the pressures and flows at each of the junction nodes of the composite process network that result in balanced flow at each of the junction nodes. Thereafter, the method 200 uses the determined pressures and flows at each of the junction nodes to sequentially solve for the pressures and flows at each of the other, non-junction nodes of the process network.

FIG. 3A illustrates a flow diagram of a process network 300 as an example of a process network for which the method of FIG. 2 can be used to perform a simulation. In particular, FIG. 3A illustrates a fairly complicated process network or flow system 300 having a number of process components or elements separated by nodes, some of which are junction nodes at which various fluid flows converge or diverge and others of which are non-junction nodes. More specifically, the example process network 300 of FIG. 3A includes a set of starting nodes $S_1$-$S_3$ at which flow originates and a set of stopping nodes $S_4$-$S_{10}$ at which flow ends in the process network 300. Generally speaking, starting and stopping nodes (also referred to herein as boundary nodes) are nodes in a process network at which pressures are fixed or are only slightly changing and are typically known via, for example, design, feedback from an actual process network, established by set-points, they are calculated elsewhere, etc. Thus, the input or output pressures at the starting and stopping nodes of a process network are generally known either by design or because they are established by user settable set-points, etc.

In any event, the process network 300 of FIG. 3A also includes a set of process elements (E1-E33) downstream of one or more of the starting nodes $S_1$-$S_3$ and upstream of one or more of the stopping nodes $S_4$-$S_{10}$, with the process elements E1-E33 being disposed along various flow paths $F_1$-$F_{18}$ that either converge or diverge at one or more junction nodes $J_1$-$J_8$. In particular, the junction nodes $J_1$-$J_8$ are nodes in the process network 300 at which flows converge or diverge. The process network 300 includes other nodes in the form of nodes between the various process elements E1-E33 disposed along a flow path at which no junction node exists. Thus, a process node exists between the process elements E1 and E2, between the process elements E2 and E3, etc., of FIG. 3A. These non-junction nodes will also be referred to herein as sub-nodes. Because flows converge or diverge at the junctions nodes $J_1$-$J_8$, the manner of determining the pressure at the junction nodes $J_1$-$J_8$ is more computationally complicated than that of determining pressures at the sub-nodes (i.e., the nodes between process elements along a particular flow path).

In any event, the process elements E1-E33 in this case can be any desired types of elements such as valves, pipes, etc. For the sake of illustration and brevity of description, the process elements E1-E33 of FIG. 3A will be assumed to be non-storage elements, i.e., elements that do not store mass. As a result, it can be assumed that the flows along any flow path disposed between any set of two adjacent starting or stopping nodes and junction nodes, or between any two adjacent junction nodes is relatively constant (i.e., the same) along the entire flow path. The set of flow paths $F_1$-$F_{18}$ along which flows travel between the various starting and stopping nodes $S_1$-$S_{10}$ and the junction nodes $J_1$-$J_8$ are illustrated in FIG. 3A.

As also illustrated in FIG. 3A, each of the process elements E1-E33 has a flow conductance K. As such, an individual flow and pressure associated with each of the process elements E1-E33 can be determined for each of the process elements E1-E33. Thus, as illustrated in FIG. 3A, the process elements E1, E2, and E3 have flow conductances $K_1$, $K_2$, $K_3$, respectively, and the individual pressures and flows (i.e., the pressures and flows at the output of each sub-node in the flow path $F_1$) are illustrated in FIG. 3A using the labels P (for pressure) and f (for flow) between the process elements E1-E3. Thus, the flow at the output of the process element E1 sub-node is $f_1$ and the pressure at the output of the process element E1 sub-node is $P_1$. Here, it will be noted that the outlet pressure $P_3$ of the process element E3 sub-node is generally equal to the inlet pressure of the junction node $J_1$. While not illustrated in FIG. 3A, each process element E will have a flow conductance K and an individual pressure P and a flow f will exist and can be determined at the output or input of each process element E.

Referring back to FIG. 2, the method 200 includes a block 202 that identifies the junction nodes and process flow paths of the process network being simulated. More particularly, a block 202 may accept and/or access a definition of the process network 300 stored on a memory. This process network definition may define the various components and interconnections of the process network 300, may be input by a user or determined from any other source and may be stored on a computer-readable memory available to the block 202. Using the process network definition, the block 202 first determines a set of straight line flow paths $F_1$ to $F_n$ within a process network wherein each of the flow paths $F_1$ to $F_n$ is a single flow path between two starting or stopping or junction nodes (e.g., between a starting node and a junction node, between two junction nodes, or between a junction node and a stopping node). Generally speaking, the flows $F_1$ to $F_n$ will be established as flows going through process elements that are non-storage type of elements (i.e., that do not store mass).

The determined flow paths $F_1$ to $F_{18}$ associated with the process network 300 that would be determined by the block 202 are illustrated in FIG. 3A. In this example, the flow path $F_1$ is the flow path between the starting node $S_1$ and the junction node $J_1$ and includes process elements E1, E2, and E3. In a similar manner, a flow path $F_2$ is illustrated as being disposed between the junction nodes $J_1$ and $J_2$ and includes process elements E10 and E11; a flow path $F_3$ is illustrated as being disposed between the junction nodes $J_1$ and $J_3$ and includes process elements (or sub-nodes) E4 and E5; a flow path $F_4$ is illustrated as being disposed between the starting node $S_2$ and the junction node $J_2$ and includes a single process element E12; a flow path $F_5$ is illustrated as being disposed between the junction node $J_2$ and the junction node $J_4$ and includes the process elements E13, E14 and E15; a flow path $F_6$ is illustrated as being disposed between the junction node $J_3$ and the junction node $J_5$ and includes the process elements E6 and E7; and a flow path $F_7$ is illustrated as being disposed between the junction node $J_3$ and the stopping node $S_{10}$ and includes the process elements E8 and E9. Additional flow paths between other nodes and flows through other process elements are also indicated in FIG. 3A. While not illustrated in FIG. 3A, individual flows (f), pressures (P) are associated with each of the sub-nodes defined by each of the process elements E4-E33.

Of course, the block 202 may determine the flow paths $F_1$ to $F_n$ automatically using any appropriate analysis routine, or the flow paths $F_1$ to $F_n$ may be determined beforehand by, for example, a process engineer or other user and may be stored in a memory available to the block 202. In this later case, the block 202 may determine the flow paths $F_1$ to $F_n$ by recovering the indications of these flow paths from the memory. Alternatively, the block 202 may determine the flow paths $F_1$ to $F_n$ directly from a user via a user interface, if so desired, or may determine these flow paths in any other desired manner.

Next, a block 204 determines a flow conductance value for each of the process elements in each flow path. The flow conductances $K_1$, $K_2$ and $K_3$ for the process elements E1, E2 and E3, respectively, are illustrated in FIG. 3A. Of course, flow conductances K are determined for each of the process elements E4-E33 of FIG. 3A. Generally speaking the flow conductance of each process element indicates the flow characteristics of that element. The flow conductance of certain elements, such as pipes, may remain fixed and may be dependent on their physical characteristics as manufactured. In this case, flow conductances may be determined, for example, from a user, a process engineer, a manufacturer design specification, etc., and may be stored in a memory. Moreover, in this case, the block 204 may determine these flow conductance values by retrieving these values from the memory. However, in some cases, such as with valves and other alterable flow elements, the flow conductance of the element may be dependent on the setting or state of the process element, the type of fluid flowing through the element, or one or more other factors. Thus, the position of a valve stem or other moveable valve element in a valve will affect the flow conductance of the valve, in addition to other physical characteristics of the valve. As a result, in these cases, the block 204 may implement a model, such as a first principles model, of the process element to determine the flow conductance of that element at the particular time being simulated, that is, based on the state of the process element and/or the state of the process as well as other process data or characteristics for the process element.

Thus, as will be understood, the block 204 may determine the flow conductances $K_1$ to $K_o$ (wherein o is the number of process elements) automatically using any appropriate analysis routine, which may include accessing a set of stored or known flow conductances $K_1$ to $K_{33}$ for the system 300 of FIG. 3A stored in a memory or provided by a user. However, this analysis routine may determine these flow conductances based on a model that accesses data for the process element from a memory or a user as well as other process characteristics, such as process settings, states of the process element, fluid characteristics, etc.

Next, a block 206 determines a linearized flow conductance value for each of the determined flow conductances $K_1$ to $K_o$. In particular, the standard pressure-flow relationship for each process element or component E can be formulated as:

$$F = K\sqrt{\Delta P}$$

wherein $\Delta P$ is the differential pressure across the process element with a flow conductance K and F is the fluid flow through the process element. The block 206 linearizes this pressure flow relationship for each component block by producing a new flow conductance value $\tilde{K}$ that satisfies the equation:

$$F = \tilde{K} \cdot \Delta P$$

Of course, there are many known techniques for linearizing non-linear equations, and the block 206 can use any desired technique to linearize the well known non-linear flow/pressure relationship described above. However, one linearization method that could be used follows a standard Taylor series expansion approach.

Here, assuming a generic 2-dimensional function is $f(x_1, x_2)$, Taylor expansion is represented by:

$$f(x_1, x_2) \approx f(x_{10}, x_{20}) + f_{x1}'(x_{10}, x_{20}) \cdot (x_1 - x_{10}) + f_{x2}'(x_{10}, x_{20}) \cdot (x_2 - x_{20})$$

Where $x_{10}$ and $x_{20}$ are variable values at the linearization point. In general, these values are equal to or are based on calculation results obtained from a previous iteration time, a previous loop time, or a previous sampling time or simulation cycle. In the pressure-flow calculation case, assuming that the original pressure-flow relationship is:

$$f = K\sqrt{P_1 - P_2}$$

where $f$ is the flow, K is the flow conductance, and $P_1$ and $P_2$ are pressures at the element inlet and outlet, respectively, then, following a standard Taylor expansion, the flow equation can be written as:

$$f \approx K \cdot \sqrt{P_{10} - P_{20}} + \frac{K \cdot (P_1 - P_{10})}{2\sqrt{P_{10} - P_{20}}} - \frac{K \cdot (P_2 - P_{20})}{2\sqrt{P_{10} - P_{20}}}$$

$$= \frac{K \cdot (P_{10} - P_{20})}{2\sqrt{P_{10} - P_{20}}} + \frac{K \cdot (P_1 - P_2)}{2\sqrt{P_{10} - P_{20}}}$$

$$\approx \tilde{K} \cdot (P_1 - P_2)$$

Where the linearized conductance $$\tilde{K} = \frac{K}{\sqrt{P_{10} - P_{20}}}.$$

As will be understood, this linearization process may introduce some approximation into the pressure and flow calculations performed later. However, this approximation does not necessarily affect the accuracy of the simulation result because the original flow conductance K for each process element is only pre-determined in an approximate manner in the first place, and needs to be fine tuned according to actual field data during the simulation. Thus, this linearization process will speed up the calculations performed in later steps of the simulation.

Next, a block 208 determines a set of composite flow elements within the process being simulated to thereby simplify the process network being simulated. In particular, the block 208 groups all process elements (e.g., piping components) in each particular flow path $F_1$ to $F_n$ as a single composite process component with a combined or composite linearized flow conductance $\tilde{K}'$. For example, the process elements E1, E2 and E3 in flow path $F_1$ of FIG. 3A can be combined as a single composite process element with a composite linearized flow conductance $\tilde{K}_1'$. As is known, the composite linearized flow conductances $\tilde{K}'$ for any group of process elements along a single flow path F may be determined as:

$$\tilde{K}' = 1 \bigg/ \left( \sum_{i=1}^{j} 1/\tilde{K}_i \right)$$

wherein j is the number of process elements in the flow path for which the composite linearized flow conductance value is being determined. Thus, the composite linearized flow conductance value $\tilde{K}_1'$ for the flow path $F_1$ would be calculated as:

$$\tilde{K}_1' = 1/(1/\tilde{K}_1 + 1/\tilde{K}_2 + 1/\tilde{K}_3)$$

An illustrative example of the process network 300 simplified to have a set of flow paths $F_1$ to $F_{18}$ with starting, stopping and junction nodes separated by combined or grouped process elements each with a composite linearized flow conductance is illustrated as the composite process network 302 in FIG. 3B. Here, it will be noted that the process elements E1-E3 are combined into a single grouped element with a composite linearized flow conductance $\tilde{K}_1'$, the process elements E10 and E11 are combined or grouped into a combined element with a composite linearized flow conductance $\tilde{K}_2'$, the process elements E4 and E5 are combined or grouped into a combined element with a composite linearized flow conductance $\tilde{K}_3'$, the process elements E13, E14 and E15 are combined or grouped into a combined element with a composite linearized flow conductance $\tilde{K}_5'$, the process elements E6 and E7 are combined or grouped into a combined element with a composite linearized flow conductance $\tilde{K}_6'$, and the process elements E8 and E9 are combined or grouped into a combined element with a composite linearized flow conductance $\tilde{K}_7'$. Moreover, as there is only one process element in the flow path $F_4$, the process element E12 will have a grouped or combined linearized flow conductance $\tilde{K}_4'$ that is equivalent to or the same as the linearized flow conductance value $\tilde{K}_{12}$. Of course, the other process elements are combined in the other flow paths of the system 302 of FIG. 3B to illustrate the entire process network 300 of FIG. 3A simplified to include a set of junction and starting and stopping nodes separated by grouped or composite process elements in each flow path, each with a composite linearized flow conductance. Thus, composite linearized flow conductances $\tilde{K}_1'$ to $\tilde{K}_{18}'$ are illustrated for each of the other flow paths $F_1$ to $F_{18}$ in FIG. 3B. Now, in this case, the pressure-flow relationship for the composite process block or element in, for example, the flow path $F_1$ of the process network 300 of FIG. 3A would become:

$$F_1 = \tilde{K}_1' \cdot (P_{S1} - P_{J1})$$

wherein $P_{S1}$ is the pressure at the $S_1$ node and $P_{J1}$ is the pressure at the junction node $J_1$.

As a result of combining the linearized process elements in this manner, the block 208 basically creates a composite or simplified process network having junction nodes (and starting and stopping nodes) separated by a single combined or composite process element with a composite linearized flow conductance. This step of the technique thus groups sub-nodes along a single flow path to combine various sub-nodes into a condensed set of nodes or process elements separated by junction nodes.

Next, a block 210 determines a set of simultaneous equations to use in solving for the pressures and flows at each of the junction nodes of the simplified process network, such as the simplified process network 302 of FIG. 3B. Generally speaking, the block 210 will use equations that set the flow balance at each of the junction nodes to zero. As an example, the block 210 may determine a flow summation at each junction nodes as:

$$\sum_{i=1}^{n} F_i - \sum_{j=1}^{m} F_j = 0$$

wherein n is the number of flows into the junction node and m is the number of flows out of the junction node. Moreover, the block 210 may set the flow through any flow path as a function of the composite linearized flow conductance along the path and the pressures at the junction nodes on either side of the path as:

$$F_i = \tilde{K}_1' \cdot \Delta P$$

Wherein:
$F_i$ is the flow through a flow path exiting one junction node and entering another junction node,
$\tilde{K}_1'$ is the composite linearized flow conductance across the flow path, and
$\Delta P$ is the pressure drop across the flow path.

For example, for the junction node $J_1$ of FIG. 3B, the flows into and out of the junction node $J_1$ can be established as:

$$F_1 = \tilde{K}_1' \cdot (P_{S1} - P_{J1})$$

$$F_2 = \tilde{K}_2' \cdot (P_{J1} - P_{J2})$$

$$F_3 = \tilde{K}_3' \cdot (P_{J1} - P_{J3})$$

Wherein:
$P_{S1}$ is the nodal pressure at the starting node $S_1$;
$P_{J1}$ is the nodal pressure at the junction node $J_1$;
$P_{J2}$ is the nodal pressure at the junction node $J_2$; and
$P_{J3}$ is the nodal pressure at the junction node $J_3$.
Moreover, the flows at this junction would be summed as:

$$F_1 = F_2 + F_3$$

A similar set of pressure and flow equations can be determined for each of the junction nodes $J_1$ to $J_{18}$ in the simplified process network 302 of FIG. 3B.

However, the block 210 will typically dynamically determine these equations, as these equations may need to be reconfigured based on settings of the various process components. For example, if a process component represents a valve and the valve is closed, the corresponding flow conductance for that process component will be zero. This fact will also result in the composite linearized flow conductance for the flow path in which the process component lies being set to zero. In this case, it is desirable to reconstruct the nodal equations to take into account this zero flow path. For example, during a normal operating situation, the pressure and flow equations surrounding the junction node $J_4$ are determined as:

$$F_2 + F_4 = F_5$$

$$F_5 = F_9 + F_{10} + F_{11}$$

$$F_{10} + F_{11} = F_{16}$$

and $$F_8 + F_9 = F_{14} + F_{15}$$

When $\tilde{K}_5' = \tilde{K}_9' = \tilde{K}_{16}' = 0$, the equations to be solved will change (in real-time) to:

$$F_2 + F_4 = 0$$

and $$F_8 = F_{14} + F_{15}$$

In this manner, a matrix singularity problem during equation solving can be avoided.

After all of the equations based on all of the flows into and out of all of the junction nodes have been established in this manner, a block 212 then solves the determined equations simultaneously to obtain pressure values for each junction node, i.e., the pressure values $P_{J1}$, $P_{J2}$, $P_{J3}$, etc. and to obtain flow values $F_1$ to $F_n$ within the simplified process network 302. Because only the pressures at the junction nodes are solved at the block 212, instead of the pressures at all of the process nodes or at all of the process components, the computational time is much less. Of course, the block 212 may use any desired technique for solving the simultaneous equations set up by or established by the block 210, including for example well known matrix-based equation solving techniques (such as Gaussian elimination, LU decomposition, etc.)

Now, with the pressures at each of the junction nodes determined, a block 214 continues to solve pressures and flows at each of the other nodes of the process network 300 using, for example, a sequential solving technique. That is, the block 214 may determine the flow in any flow path (i.e., along or through each composite process element) between any two adjacent junction nodes using sequential solving.

In particular, if need be, the block 214 can first calculate the flows in the straight paths between the junction nodes or between starting and stopping nodes and junction nodes (as these flows are all equal in any particular flow path) using the pressures at the boundary and/or junction nodes. Thereafter, the block 214 determines the pressure of each process element or process component based on adjacent component pressures and the main flow in the flow path through that process element.

For example, the fluid flow within the flow path $F_1$ (the flow through process elements E1, E2 and E3 of FIG. 3A) can be calculated as:

$$F_1 = \tilde{K}_1' \cdot (P_{S1} - P_{J1})$$

Thereafter, the pressures $P_1$ and $P_2$ at the outputs of the process elements E1 and E2, respectively, can be calculated as:

$$P_1 = P_{S1} - \frac{F_1}{\tilde{K}_1}$$

-continued $$P_2 = P_1 - \frac{F_1}{\tilde{K}_2}$$

As will be understood, this process can be completed sequentially or in turn from one end of each flow path to another end of the flow path to determine pressures and flows at each of the sub-nodes or non-junction nodes along each flow path of the process network 300 of FIG. 3A. Thus, the pressures and flows at each of the process elements E1-E33 of FIG. 3A can be determined in this same manner.

After completion of the sequential calculations along each flow path of the process network, the simulation system has determined pressures and flows at each process network node and thus a block 216 of FIG. 2 can begin the next sampling period in which new process plant variables (such as valve settings, operations, etc.) may be determined and modeled to produce new flow conductances at each process element. If desired, the block 202 may not need to be performed during each simulation cycle as the flow paths and junction nodes will typically remain constant in the process network until process network changes are made. However, it is desirable to recalculate or redetermine flow conductances in some or all of the process elements in each simulation cycle, and especially in those process elements in which a changing state of the process may affect the flow conductance through the process element, such as a valve.

In any event, the hybrid approach described above utilizes the advantages of both sequential and simultaneous solving mechanisms, and generally avoids disadvantages from either of these methods. In particular, this calculation method enables fast execution speeds during each loop time or simulation cycle as it uses a reduced set of simultaneous linear equations based only on the pressures and flows at the junction nodes of the process network. Therefore, this method is suitable for real-time simulation applications. Moreover, because the simultaneous equations are regenerated during each simulation cycle using flow conductance values based on the states of the various process elements, this method avoids singularity problems when certain combinations of process components have zero flow conductance.

While the above described simulation method has been described using linearization of the quadratic relationships between pressure and flows in the process network to increase computational efficiencies, it will be understood that the linearization step could be skipped, in which case the method would use the original quadratic pressure-flow equations without linearization in determining and solving the simultaneous equations and in determining pressures and flows in each sub-node of the process network. This type of operation would lead to more accurate calculations but would decrease the computational efficiency of the technique to a certain degree. However, as long as the process network structure and the equations based thereon are configured during each simulation cycle (i.e., on the fly), singularity problems caused by closed valves would still be avoided.

While this simulation approach has been described as being implemented to simulate process networks, such as industrial process networks, other types of networks using other physical principals or equations may be simulated using this approach as well. Thus, for example, this simulation approach could be used to simulate the operation of an electrical network using well known current and voltage relationships instead of the pressure and flow relationships described herein. In this case, the flow conductances would be determined as electrical admittance.

Figure 4:
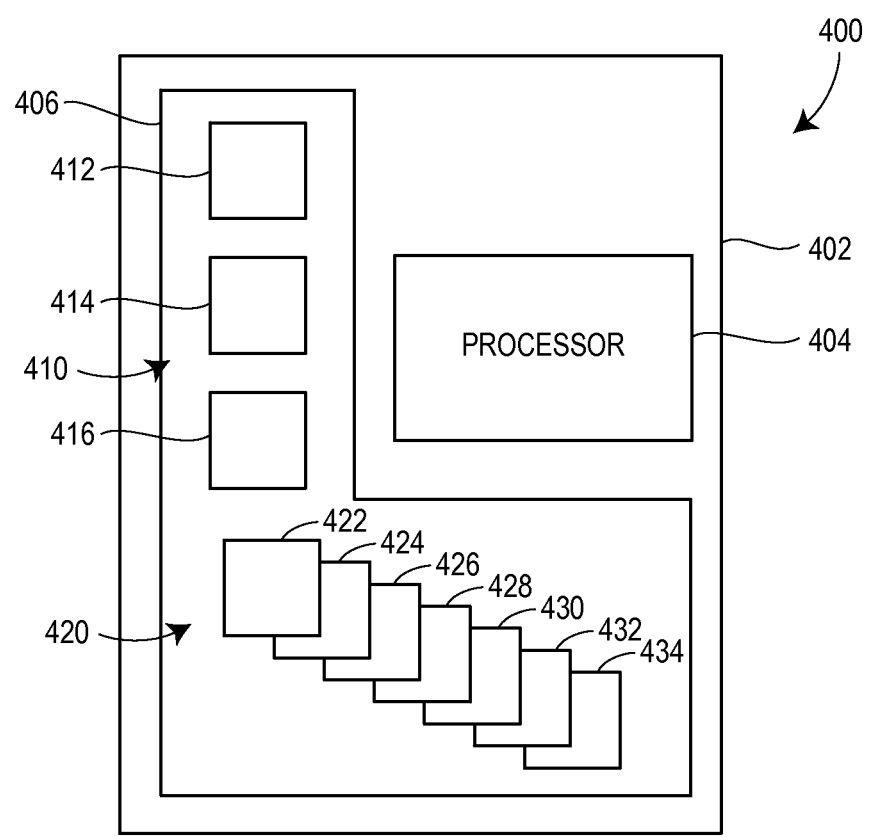
FIG. 4 is a block diagram of a centralized simulation system that may be used to perform the pressure and flow calculation technique of FIG. 2.

FIG. 4 illustrates a centralized simulation system 400 that may use the simulation techniques described above to simulate a process network or other network. The centralized simulation system 400 includes a computer device 402, which may be any type of stand-alone or networked computer device, having a processor 404 and a computer memory 406 therein or associated therewith. Moreover, the centralized simulation system 400 includes various simulation routines 410 stored in the memory 406 and operable or executable on the processor 404 to implement the features or routines described above with respect to FIG. 2. In particular, the simulation system 400 may include a routine 412 that executes on the processor 404 to receive and/or store data in the memory 406 defining the fixed or user specified configuration or definition of the process network being simulated including the physical characteristics of the process elements and the manner in which these elements are interconnected within the process network. Moreover, the routine 412 may receive or determine and may then store flow conductances or other values for the process elements, including a set of models that define the operation of the various process elements. These models may be, for example, first principles models or other types of models to be used to model the operation of each process element or groups of process elements within the process network being simulated. Still further, a routine 414 is a user interface routine that executes on the processor 404 to interface with a user (such as an operator) via a display screen and/or via any other input/output devices (not shown in FIG. 4) before, during and after a simulation procedure that is run using the process configuration data as determined and stored by the routine 412 as well as data or inputs provided by a user during run-time of the simulation system. Thus, the interface routine 414 may provide a simulation interface to a user to allow the user to see or determine the results of the simulation during each simulation cycle to thereby view the simulated operation of the process network being simulated. Moreover, the interface routine 414 may accept information or inputs from the user to change variables, settings, setpoints, etc., of the simulated process network to allow the user to direct or change the process conditions, implement new or different control routines, etc., in response to the simulated outputs or results, for example.

Still further, a routine 416 may execute on the processor 404 to direct or implement a simulation of the process network using the process network configuration data (which may include configuration data associated with a control technique or control routines used to control the process being simulated, the process models and process equipment models stored in the memory as part of the process network configuration, the user input provided by the interface routine 414, etc.)

Importantly, during each simulation cycle, the routine 416 may use one or more other routines 420 (also referred to as sub-routines) associated with determining the pressures and flows at each node of the process network based on the current states of the control parameters and the process elements or components. In particular, the routines 420 may be used to implement various steps of the method 200 of FIG. 2. For example, a routine 422 may execute on the processor 404 to determine the flow paths ($F_1, F_2, \ldots F_n$) and the junction nodes ($J_1, \ldots J_m$) of the process network based on the process network configuration data stored in the memory. A routine 424 may execute on the processor 404 to model the operation of each of the process elements to determine certain characteristics of the element, including for example, to determine the flow conductances ($K_1, K_2, \ldots K_o$) of the various process elements along each of the flow paths based on the stored process element data, process parameter or state data and the models stored for the process element. In one example, the routine 424 may execute the process equipment models using the process element data, the current control and process parameter data, etc., to determine, for example, the current flow conductances of each of the process elements.

A routine 426 may execute on the processor 404 to determine the linearized flow conductances ($\tilde{K}_1, \tilde{K}_2 \ldots \tilde{K}_o$) for the process elements and a routine 428 may execute on the processor 404 to determine the composite linearized flow conductances ($\tilde{K}_1', \tilde{K}_2' \ldots \tilde{K}_n'$) for the various fluid flow paths $F_1$ to $F_n$.

Thereafter, a routine 430 may determine a set of simultaneous equations to solve for pressure and, if desired, flow at all of the junction nodes of the simulated process network using the composite linearized flow conductances (or a set of combined flow conductances if linearization is not used) as well as the current or known pressures at the boundary nodes of the simulated process. The routine 430 may, during each simulation cycle, check to determine whether any of the flow conductance values is zero, to thereby alter the set of equations to be used to determine the pressures (and flows) at the junction nodes. A routine 432 may then execute on the processor 404 to solve the set of simultaneous equations to thereby determine the pressure (and flows) at each of the junctions nodes of the process network being simulated. Next, a routine 434 may execute on the processor 404 to determine the pressure (and flow) at each sub-node (process element) within each of the flow paths of the process network based on pressures and flows at the process network junction nodes as determined by the routine 432 using the sequential pressure calculation technique described above.

Of course, the routines 422-434 may be all be combined into a single routine or may be called separately as needed by the simulation control routine 416 during each simulation cycle (if needed) to perform the simulation technique described with respect to the method 200 of FIG. 2. The simulation control routine 416 may provide new simulated outputs to the user using the interface routine 414, which may enable the user to make changes to the control of the simulated process to thereby affect the operation of the simulation being performed or to take other steps. Because all of the simulation routines are stored and executed at the same computer device 402, the simulation can be performed quickly with no or very little inter-computer communications. However, if desired, the user interface device and user interface routine 414 may be executed in a different device communicatively connected to the centralized computer 402, if so desired.

The hybrid simulation calculation technique described herein can also be performed in a distributed simulation system having various different simulation drops (i.e., computer or processor devices that implement or execute portions of the simulation for different portions of the process), wherein the simulation drops are communicatively coupled via any desired connection or communication network, including for example, a wired or wireless communication network, a bus based network, private or public networks, including any desired local area network (LAN) or wide area network (WAN) such as, for example, the Internet.

Figure 5:
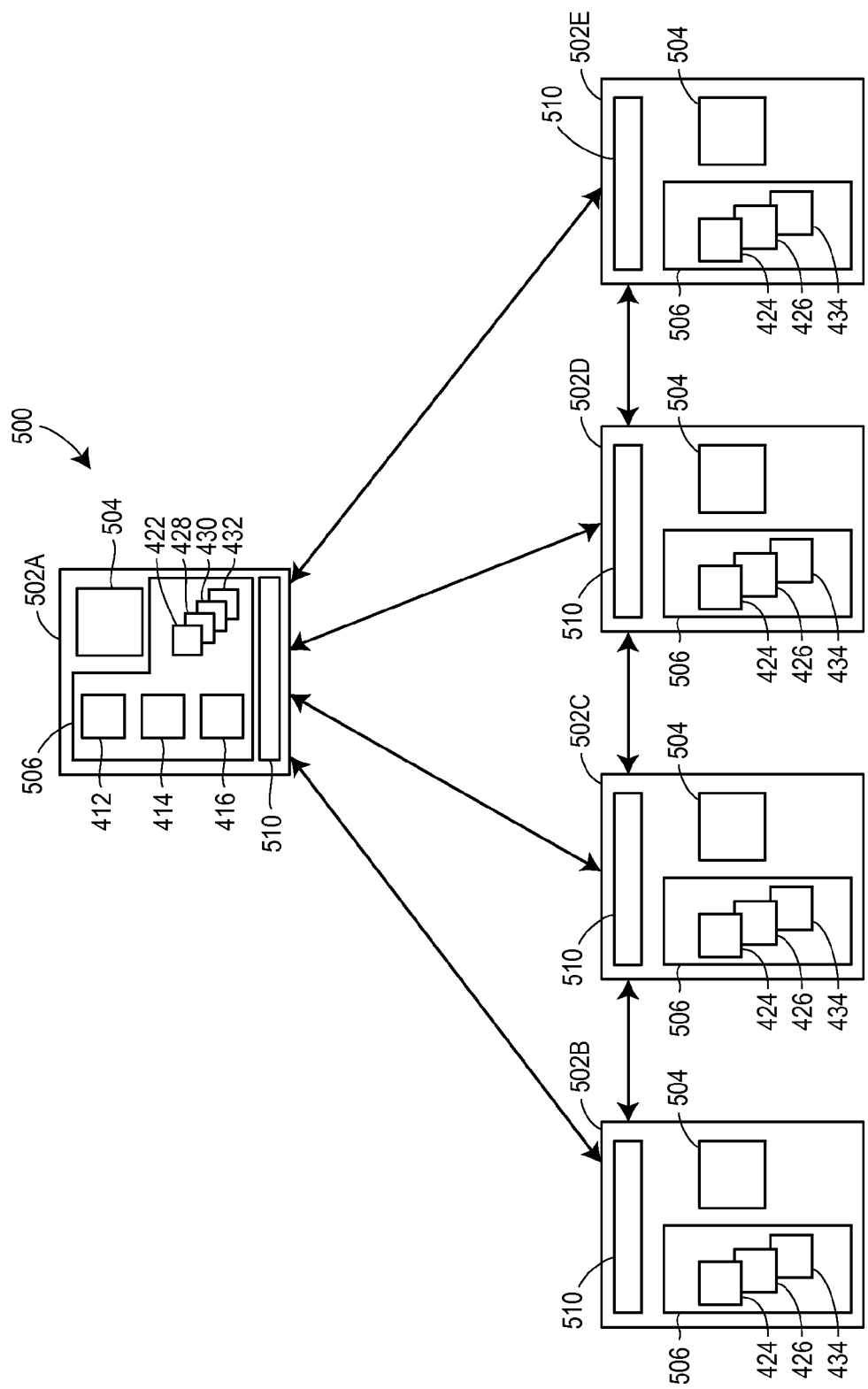
FIG. 5 is a block diagram of a partially distributed simulation system having a coordinating simulation module and various distributed simulation modules located in different simulation drops or computing devices and configured to simulate the operation of the plant network using the process pressure and flow calculation technique of FIG. 2.

FIG. 5 illustrates one example of a distributed simulation system 500 that may be used to implement the simulation calculation technique of FIG. 2. As illustrated in FIG. 5, the distributed simulation network 500 includes a series or set of simulation drops 502A-502E, each of which is a separate computer or processor device that executes programming or routines to perform various simulation functions. Thus, each of the simulation drops 502A-502E includes a processor 504 and a memory 506. In addition each of the simulation drops 502A-502E includes one or more of the routines described above with respect to the centralized simulation system 400 of FIG. 4. It will be understood that, while only five simulation drops are illustrated in FIG. 5, a distributed simulation system could include any desired number of simulation drops.

One of the simulation drops 502A is a coordinating simulation drop that may perform the various setup, user interface activities and solving of simultaneous equations described above with respect to the system 400 of FIG. 4, while each of the other simulation drops 502B to 502E is a simulation drop associated with or responsible for simulating one piece or a group of process equipment. Thus, the coordinating simulation drop 502A may store and execute the user interface, storage and simulation control routines 412, 414, and 416 which may operate to perform various user interface activities and to coordinate calculations performed by each of the other simulation drops 502B-502E during each simulation cycle. Importantly, the coordinating simulation drop 502A will also store and execute various of the routines 422-434 and, in particular, will store the routines 430 and 432 responsible for determining and solving the simultaneous set of equations used to determine pressures (and flows) at each of the junction nodes of the process network being simulated. Moreover, the coordinating simulation drop 502A may store and execute the routines 422 and 428 to determine the flow paths and junction nodes within the process network being simulated and to determine the composite linearized flow conductances for each of the composite process elements. Moreover, while not shown in FIG. 5, if desired, the coordinating simulation drop 502A may store and execute the routine 426 to linearize each of the determined process element flow conductances.

Generally speaking, each of the simulation drops 502B-502E will be associated with simulating a particular piece of equipment or a node of the process network or a group of equipment or nodes of the process network being simulated. Moreover, as illustrated in FIG. 5, each of the simulation drops 502A-502E includes communication software and/or hardware modules 510 that enable the simulation drops 502A-502E to communicate with one another via any desired communication structure or network. Generally speaking, each of the simulation drops 502B to 502E will perform two way communications directly with the coordinating simulation drop 502A and may perform two way communications with adjacent simulation drops in the set of simulation drops 502B-502E. For these purposes, adjacent simulation drops are simulation drops that are simulating the operation of process network equipment that is adjacent to one another in the process network being simulated.

As will be understood, each of the simulation drops 502B-502E may store and execute one or more of the routines 424 to model the operation of the one or more process elements associated with that simulation drop (and may have stored the associated process data and the process element models for that equipment in memory within the drop). During this modeling process, the routines 424 may determine a new or current flow conductance value of one or more of the process elements being modeled. In this manner, each of the simulation drops 502B-502E is associated with and is responsible for modeling the operation of one or more of the process elements and stores the models to perform this activity. Moreover, as indicated in FIG. 5, each of the simulation drops 502B-502E may communicate with the coordinating simulation drop 502A via the communication modules 510 during each simulation cycle to obtain new process variable and state data to perform these calculations. Still further, the simulation drops 502B-502E may store and execute the linearization routine 426 to produce the linearized flow conductance values of the process elements being simulated by that simulation drop.

The simulation drops 502B-502E use the communication modules 510 to communicate with the coordinating simulation drop 502A to provide the modeled data, the flow conductance values, the linearized flow conductance values, etc., to the coordinating simulation drop 502A during each simulation cycle and to receive pressures and flows associated with process elements as needed from the coordinating simulation drop 502A after the coordinating simulation drop 502A determines and solves the set of simultaneous equations during that simulation cycle.

After receiving the pressures and flows of the junction nodes or of at least a set of adjacent junction nodes from the coordinating simulation drop 502A during a simulation cycle, the simulation drops 502B o 502E may sequentially execute the routines 434 to determine the pressures (and flows) at each of the process elements or sub-nodes with which these simulation drops are associated. Moreover, these simulation drops may communicate these calculated pressures (and flows) to adjacent simulation drops, for example, downstream simulation drops, to allow the adjacent simulation drops to then compute the pressures (and flows) for the portions of the process network associated with those simulation drops.

In one case, when the simulation modules are disposed in separate processing devices, or even in the same processing device, adjacent simulation modules may communicate data upstream and downstream by simply writing the data into a memory location associated with a system ID assigned to or associated with the respective upstream or downstream simulation module or drop, making that data immediately available to the upstream or downstream simulation module when that simulation module executes. Of course, data can be communicated to a memory within the same processing device or to a memory in a different processing device, via a communication network disposed between the two different devices. This communication mechanism is simple, as each simulation module communicates the most recent data from that simulation module to the upstream and downstream simulation modules which use that data, without the need for a large amount of communication overhead and without the need to send a large amount of data between any two devices (or even between any two simulation modules). Importantly, because each simulation module broadcasts its own system ID to neighboring or adjacent simulation modules, including to the coordinating simulation module, the systems of equations can be constructed at the coordinating simulation module by chain rule during run-time operation. This feature allows, under certain circumstances, some modules to be selectively included in the systems of equations determined at the coordinating simulation module, and some other modules to be excluded from the systems of equations with their simulated pressure being unchanged or set to pre-determined values.

In this manner, the distributed simulation system 500 of FIG. 5 may operate to perform both the simultaneous calculation steps of the method of FIG. 2 at a central or coordinating simulation drop while spreading out other simulation tasks, such as the equipment modeling and the sequential calculation steps of the method of FIG. 2 among various distributed simulation drops, to thereby decrease the computation load on the central or the coordinating simulation drop.

While the simulation technique of FIG. 2 is described for use in the simulation of a process network system in which fluid pressures and flows are being determined, this simulation technique can be used to perform other types of simulations as well to calculate other physical flow characteristics or parameters, such as electrical current and voltage (using equations that express current/voltage relationships in part based on flow conductance parameters of electrical admittance). Thus, for example, this simulation technique can be used to perform electrical network simulations, communication network simulations, transportation/traffic network simulations, etc.

When implemented, any of the simulation software and simulation modules described herein may be stored in any computer readable memory such as on a magnetic disk, a laser disk, or other storage medium, in a RAM or ROM of a computer or processor, etc., and are executable on a computer processor. Likewise, this software or these modules may be delivered to a user, a process plant or an operator workstation using any known or desired delivery method including, for example, on a computer readable disk or other transportable computer storage mechanism or over a communication channel such as a telephone line, the Internet, the World Wide Web, any other local area network or wide area network, etc. (which delivery is viewed as being the same as or interchangeable with providing such software via a transportable storage medium). Furthermore, this software may be provided directly without modulation or encryption or may be modulated and/or encrypted using any suitable modulation carrier wave and/or encryption technique before being transmitted over a communication channel.

While the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

The invention claimed is:

1. A simulation system for simulating the operation of a process network having a set of physical plant elements through which mass flows, the process network including a plurality of process nodes including a multiplicity of junction nodes and one or more non-junction nodes that form different sub-sets of the plurality of process nodes in the process network, the system comprising:
  a computer device including a processor and a computer readable memory;
  a definition of the process network stored on the computer readable memory, the definition of the process network including the plurality of process nodes associated with the process network at which pressures or flows are to be determined in a simulation, wherein two or more of the process nodes are the junction nodes at which flow within the process network converges or diverges, and one or more of the process nodes are the non-junction nodes associated with process elements within the process network; and
  a simulation routine stored on the computer readable memory that executes on the processor to determine the pressures and flows at each of the plurality of process nodes of the process network during each of a multiplicity of simulation cycles, the simulation routine including:
    a first routine stored on the computer readable memory that executes on the processor to solve a set of simultaneous equations expressing a pressure/flow relationship to determine the pressure at each of the two or more junction nodes without determining the pressure at each of the one or more non-junction nodes and to determine the flow within each of a set of flow paths between the two or more junction nodes during each of the multiplicity of simulation cycles; and a second routine stored on the computer readable memory that executes on the processor after the first routine to determine pressures at each of the one or more non-junction nodes based on the pressures at each of the two or more junction nodes determined in the first routine and the flows within the flow paths between the two or more junction nodes determined in the first routine during each of the multiplicity of simulation cycles.

2. The simulation system of claim 1, wherein the simulation routine includes a third routine stored on the memory that executes on the processor to determine a flow conductance for each of a set of process elements in the flow paths of the process network and wherein the first routine uses a set of simultaneous equations that express a pressure/flow relationship using the flow conductances of the set of process elements.

3. The simulation system of claim 2, wherein the third routine determines a linearized flow conductance for each of the set of process elements and wherein the first routine uses a set of simultaneous equations that express a pressure/flow relationship using the linearized flow conductances of each of the set of process elements.

4. The simulation system of claim 3, wherein the simulation routine includes a combining routine that combines the linearized flow conductances for two or more of the set of process elements in a single flow path to determine a composite linearized flow conductance for each of the two or more of the set of process elements in the single flow path within the process network and wherein the first routine uses a set of simultaneous equations that express a pressure/flow relationship using the composite linearized flow conductance.

5. The simulation system of claim 2, wherein the third routine is part of the simulation routine that executes during each of the multiplicity of simulation cycles and wherein the third routine executes on the processor to determine a flow conductance for at least one of the set of process elements during each of the multiplicity of simulation cycles based on a current modeled condition of the one of the process elements.

6. The simulation system of claim 5, wherein the third routine executes a model for the one of the set of process elements to determine the flow conductance for the one of the set of process elements.

7. The simulation system of claim 6, wherein the one of the set of process elements is a valve and wherein the model for the one of the set of process elements models the flow conductance of the valve based on a position of a moveable valve member within the valve.

8. The simulation system of claim 2, further including a flow conductance determining routine stored on the memory that executes on the processor to determine a flow conductance for each of a set of process elements in one or more of the flow paths of the process network and wherein the first routine uses a set of simultaneous equations that express a pressure/flow relationship using the flow conductances of the process elements.

9. The simulation system of claim 8, further including a combining routine that combines the flow conductances for each of two or more of the set of process elements in a single flow path to determine a composite flow conductance for the two or more of the set of process elements in the single flow path within the process network and wherein the first routine uses a set of simultaneous equations that express a pressure/flow relationship using the composite flow conductance.

10. The simulation system of claim 1, wherein the simulation routine includes an equation determining routine that executes to determine a new set of simultaneous equations during each of the simulation cycles.

11. The simulation system of claim 10, wherein the equation determining routine executes to determine a new set of simultaneous equations during each of the simulation cycles based on process network state data defining the state of one or more process elements during each of the simulation cycles.

12. The simulation system of claim 11, wherein the first routine executes to solve the set of simultaneous equations using a matrix solving technique.

13. The simulation system of claim 1, wherein the second routine executes to sequentially determine the pressure at each of a sub-set of the non-junction nodes of the process network along a single flow path.

14. The simulation system of claim 13, wherein the second routine executes to determine the pressure at a first one of the sub-set of non-junction nodes of the process network along the single flow path using one or more determined junction node pressures, and then determines the pressure at a second one of the sub-set of non-junction nodes of the process network along the single flow path using the pressure determined for the first one of the sub-set of non-junction nodes of the process network along the single flow path.

15. The simulation system of claim 1, wherein the first routine of the simulation routine is stored in a first memory and executed on a first processor of a first computing device and the second routine is stored in a second memory and executed on a second processor of a second computing device that is communicatively coupled to the first computing device by a communication path.

16. A method of simulating the operation of a process network having a set of physical plant elements through which mass flows, the process network including a plurality of process nodes including a multiplicity of junction nodes at which mass flow within the process network converges or diverges and one or more non-junction nodes that form different sub-sets of the plurality of process nodes in the process network, the method comprising:

using a computer device to store a definition of the process network on a computer readable memory, the definition of the process network including the plurality of process nodes associated with the process network at which pressures or flows are to be determined in a simulation, wherein two or more of the process nodes are the junction nodes at which flow within the process network converges or diverges, and one or more of the process nodes are the non-junction nodes associated with process elements within the process network; and using a computer device to determine the pressures and flows at each of the plurality of process nodes of the process network during each of a multiplicity of simulation cycles, including during each of the multiplicity of simulation cycles:

solving a set of simultaneous equations expressing a pressure/flow relationship to determine the pressure at each of the two or more junction nodes without determining the pressure at each of the one or more non-junction nodes and to determine the flow within each of a set of flow paths between the two or more junction nodes; and after the solving of the simultaneous equations, sequentially determining pressures at each of the one or more non-junction nodes based on the pressures at each of the two or more junction nodes as determined by the solving of the simultaneous equations and the flows within the flow paths between the two or more junction nodes as determined by the solving of the simultaneous equations.

17. The method of claim 16, further including using a computer device to determine a flow conductance for each of a set of process elements in the flow paths of the process network and wherein solving the set of simultaneous equations includes solving a set of simultaneous equations that express a pressure/flow relationship using the flow conductances of the set of process elements.

18. The method of claim 17, further including using a computer device to determine a linearized flow conductance for each of the set of process elements and solving a set of simultaneous equations includes solving a set of simultaneous equations that express a pressure/flow relationship using the linearized flow conductances of the set of process elements.

19. The method of claim 18, further including using a computer device to combine the linearized flow conductances for two or more of the set of process elements in a single flow path to determine a composite linearized flow conductance for the two or more of the set of process elements in the single flow path within the process network and wherein solving a set of simultaneous equations includes solving a set of simultaneous equations that express a pressure/flow relationship using the composite linearized flow conductance for the single flow path.

20. The method of claim 17, wherein determining a flow conductance includes determining a flow conductance for at least one of the set of process elements during each of the multiplicity of simulation cycles based on a current modeled condition of the one of the process elements.

21. The method of claim 20, wherein determining the flow conductance for the one of the process elements includes executing a model on the processor for the one of the process elements to determine the flow conductance for the one of the process elements.

22. The method of claim 21, wherein the one of the set of process elements is a valve and wherein executing the model for the one of the process elements includes executing the model for the one of the process elements to determine the flow conductance of the valve based on a position of a moveable valve member within the valve.

23. The method of claim 17, wherein using a computer device to determine a flow conductance for each of a set of process elements in the flow paths of the process network includes determining a flow conductance for one or more of the set of process elements during each of a multiplicity of simulation cycles.

24. The method of claim 17, including using a computer device to combine the flow conductances for each of two or more of the set of process elements in a single flow path during each of the multiplicity of simulation cycles to determine a composite flow conductance for the two or more of the set of process elements in the single flow path within the process network and solving the set of simultaneous equations includes solving a set of simultaneous equations that express a pressure/flow relationship using the composite flow conductance.

25. The method of claim 16, further including determining a new set of simultaneous equations during each of the multiplicity of simulation cycles.

26. The method of claim 25, wherein determining a new set of simultaneous equations during each of the multiplicity of simulation cycles includes using process network state data defining a state of one or more process elements in the process network to determine a new set of simultaneous equations during each of the simulation cycles.

27. The method of claim 25, wherein sequentially determining pressures at each of the non-junction nodes includes sequentially determining the pressure at each of a sub-set of the non-junction nodes of the process network along each flow path.

28. The method of claim 27, wherein sequentially determining pressures at each of the non-junction nodes includes determining a pressure at a first one of a sub-set of non-junction nodes of the process network along a particular flow path using one or more determined junction node pressures, and then determining a pressure at a second one of the sub-set of non-junction nodes of the process network along the particular flow path using the pressure determined for the first one of the sub-set of non-junction nodes of the process network along the particular flow path.

29. The method of claim 28, including using a first computer device at a first location to solve the set of simultaneous equations expressing a pressure/flow relationship to determine the pressure at each of the junction nodes without determining the pressure at each of the non-junction nodes and to determine the flow within each of a set of flow paths between the junction nodes during each simulation cycle and using one or more other computer devices at different locations than the first location to sequentially determine pressures at each of the non-junction nodes based on the pressures determined for the junction nodes and the flows within the flow paths determined by the first computer device during each simulation cycle.

30. A simulation system for simulating a flow through a network having a set of physical elements, the network including a plurality of nodes in the network including two or more junction nodes and one or more non-junction nodes that form different sub-sets of the plurality of nodes in the network, the system comprising:

a definition of the network stored on a computer readable memory, the definition of the network including the plurality of nodes associated with the network at which first and second physical flow characteristics are to be determined in a simulation, wherein two or more of the nodes are the junction nodes at which flow within the network converges or diverges, and one or more of the nodes are the non-junction nodes associated with physical elements within the network; and a simulation routine stored on the computer readable memory that executes on a processor to determine the first and second physical flow characteristics at each of the plurality of nodes of the network during each of a multiplicity of simulation cycles, the simulation routine including:

a first routine stored on the computer readable memory that executes on a processor to solve a set of simultaneous equations expressing a relationship between the first and second physical flow characteristics to determine the first physical flow characteristic at each of the two or more junction nodes without determining the first physical flow characteristic at each of the one or more non-junction nodes during each of the multiplicity of simulation cycles; and a second routine stored on the computer readable memory that executes on a processor after the first routine to determine the first physical flow characteristic at each of the one or more non-junction nodes based on the first physical flow characteristic at each of the two or more junction nodes determined in the first routine during each of the multiplicity of simulation cycles.

31. The simulation system of claim 30, further including a third routine stored on the computer readable memory that executes on a processor to use the definition of the network to determine one or more flow paths and one or more junction nodes associated with the network.

32. The simulation system of claim 30, further including a third routine stored on the computer readable memory that executes on a processor to determine a flow conductance for each of a set of elements in the network.

33. The simulation system of claim 32, further including a fourth routine stored on the computer readable memory that executes on a processor to determine a linearized flow conductance for each of the set of elements in the network.

34. The simulation system of claim 33, further including a fifth routine stored on the computer readable memory that executes on a processor to combine the linearized flow conductance values for two or more elements in a flow path of the network to determine a composite linearized flow conductance for the flow path of the network.

35. The simulation system of claim 30, further including an equation determining routine stored on the computer readable memory that executes on the processor to determine the set of simultaneous equations expressing a relationship between the first and second physical flow characteristics during each simulation cycle.

36. The simulation system of claim 35, wherein the second routine sequentially determines the first physical flow characteristic at each of the non-junction nodes by sequentially determining the first physical flow characteristic at each of a sub-set of the non-junction nodes of the network along each flow path.

37. The simulation system of claim 30, wherein the network is a process network in which fluid flows and the first physical flow characteristic is fluid pressure and the second physical flow characteristic is fluid flow.

38. The simulation system of claim 30, wherein the network is an electrical network in which electricity flows and the first physical flow characteristic is electrical voltage and the second physical flow characteristic is electrical current flow.

39. A simulation method for simulating flow through a network having a set of interconnected physical elements, the network including a plurality of nodes including two or more junction nodes and one or more non-junction nodes that form different sub-sets of the plurality of nodes in the network, the method comprising:
  storing a definition of the network on a computer readable memory, the definition of the network including the plurality of nodes associated with the network at which first and second flow characteristics are to be determined in a simulation, wherein two or more of the nodes are the junction nodes at which flow within the network converges or diverges, and one or more of the nodes are the non-junction nodes associated with physical elements within the network; and
  performing, via a computer device, a simulation of the flow through the network by determining first and second flow characteristics at each of the plurality of nodes of the network during each of a multiplicity of simulation cycles, including:
    solving a set of simultaneous equations expressing a relationship between the first and second flow characteristics to determine the first flow characteristic at each of the two or more junction nodes without determining the first flow characteristic at each of the one or more non-junction nodes during each of the multiplicity of simulation cycles; and
    after the solving of the simultaneous equations, determining the first flow characteristic at each of the one or more non-junction nodes based on the first flow characteristic at each of the two or more junction nodes as determined by the solving of the simultaneous equations during each of the multiplicity of simulation cycles.

40. The simulation method of claim 39, further including using the definition of the network to determine one or more flow paths and one or more junction nodes associated with the network.

41. The simulation method of claim 39, further including determining a flow conductance for each of a set of elements in the network during each of the simulation cycles.

42. The simulation method of claim 41, further including determining a linearized flow conductance for each of the set of elements in the network.

43. The simulation method of claim 39, further including determining a combined flow conductance for all elements in a particular flow path of the network during each of the simulation cycles.

44. The simulation method of claim 43, further including determining a linearized combined flow conductance for all elements in a particular flow path of the network during each of the simulation cycles.

45. The simulation method of claim 39, further including determining the set of simultaneous equations expressing a relationship between the first and second physical flow characteristics during each simulation cycle.

46. The simulation method of claim 39, wherein sequentially determining the first flow characteristic at each of the non-junction nodes by sequentially determining the first flow characteristic at each of a sub-set of the non-junction nodes of the network along each flow path.

* * * * *